(12) United States Patent
Sawasaki

(10) Patent No.: US 6,787,371 B2
(45) Date of Patent: Sep. 7, 2004

(54) METHOD OF FORMING FERROELECTRIC FILM, FERROELECTRIC MEMORY, METHOD OF MANUFACTURING THE SAME, SEMICONDUCTOR DEVICE, AND METHOD OF MANUFACTURING THE SAME

(75) Inventor: Tatsuo Sawasaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/397,315

(22) Filed: Mar. 27, 2003

(65) Prior Publication Data

US 2004/0016952 A1 Jan. 29, 2004

(30) Foreign Application Priority Data

Mar. 29, 2002 (JP) ........................................ 2002-095057

(51) Int. Cl.[7] .............................................. H01L 21/00
(52) U.S. Cl. .......................... 438/3; 438/240; 438/799; 257/310
(58) Field of Search .............................. 438/799, 3, 240; 427/126.3; 204/157.41; 365/65; 257/295, 310

(56) References Cited

U.S. PATENT DOCUMENTS

| 5,348,775 A | 9/1994 | Lin |
| 5,375,085 A | 12/1994 | Gnade et al. |
| 6,261,420 B1 * | 7/2001 | Kubota et al. ............ 204/157.4 |
| 6,534,207 B2 * | 3/2003 | Kubota et al. ............... 428/700 |
| 6,555,875 B2 * | 4/2003 | Kawasaki et al. ........... 257/347 |
| 2002/0031846 A1 | 3/2002 | Natori |

FOREIGN PATENT DOCUMENTS

| JP | A 5-343642 | 12/1993 |
| JP | A 6-283433 | 10/1994 |
| JP | A 7-320539 | 12/1995 |
| JP | A 2000-144419 | 5/2000 |
| JP | A 2001-94064 | 4/2001 |
| JP | A 2002-57301 | 2/2002 |

OTHER PUBLICATIONS

Yongfei Zhu et al.; "Laser–Assisted Low Temperature Processing of Pb(Zr, Ti)O$_3$ Thin Film"; Applied Physics Letters; vol. 73, No. 14; Oct. 5, 1998; pp 1958–1960.

* cited by examiner

*Primary Examiner*—Sara Crane
(74) *Attorney, Agent, or Firm*—Oliff & Berridge PLC

(57) ABSTRACT

In a method of forming a ferroelectric film according to the present invention, pulsed laser light or pulsed lamp light is applied to an amorphous oxide film formed over a substrate to form microcrystalline nuclei of oxide in the film. Crystallization of the oxide is performed by applying pulsed laser light or pulsed lamp light to the film including the microcrystalline nuclei to form the ferroelectric film.

16 Claims, 10 Drawing Sheets

METHOD OF FORMING FERROELECTRIC FILM, FERROELECTRIC MEMORY, METHOD OF MANUFACTURING THE SAME, SEMICONDUCTOR DEVICE, AND METHOD OF MANUFACTURING THE SAME

Japanese Patent Application No. 2002-95057 filed on Mar. 29, 2002, is hereby incorporated by reference in its entirety.

BACKGROUND OF THE INVENTION

The present invention relates to a method of forming a ferroelectric film, a ferroelectric memory, a method of manufacturing the ferroelectric memory, a semiconductor device, and a method of manufacturing the semiconductor device.

A ferroelectric memory (FeRAM) retains data by spontaneous polarization of a ferroelectric film used in a capacitor section. In recent years, a semiconductor device utilizing the ferroelectric memory has attracted attention.

Conventionally, a ferroelectric film having good characteristics is formed by crystallizing a ferroelectric material by a heat treatment at a high temperature. For example, a heat treatment at a temperature as high as 600 to 700° C. is necessary for crystallizing $Pb(Zr,Ti)O_3$ (PZT), and a heat treatment at a temperature as high as 700 to 800° C. is necessary for crystallizing $SrBi_2Ta_2O_9$ (SBT). The ferroelectric material is crystallized by using a heat treatment furnace, for example.

However, the heat treatment at a high temperature causes elements to be significantly damaged. For example, characteristics of a peripheral section such as an electrode deteriorate due to atom diffusion. In the case where semiconductor devices such as transistors are integrated in a ferroelectric memory, characteristics of the transistors and the like deteriorate due to thermal load applied by the high-temperature heat treatment.

BRIEF SUMMARY OF THE INVENTION

The present invention may provide a method of forming a ferroelectric film capable of reducing thermal load applied during crystallization of a ferroelectric. The present invention may also provide a method of manufacturing a ferroelectric memory by using the method of forming a ferroelectric film of the present invention, and a ferroelectric memory manufactured by using this method. The present invention may further provide a method of manufacturing a semiconductor device by using the method of manufacturing a ferroelectric memory of the present invention, and a semiconductor device manufactured by using this method.

A method of forming a ferroelectric film according to one aspect of the present invention comprises applying pulsed laser light or pulsed lamp light to an amorphous oxide film formed over a substrate to form microcrystalline nuclei of oxide in the film, and applying pulsed laser light or pulsed lamp light to the film to crystallize the oxide, so that a ferroelectric film is formed.

Figure 1A:
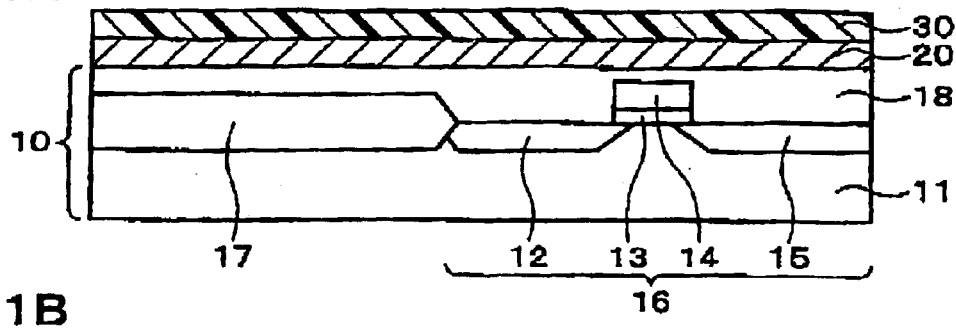
FIGS. 1A to 1D are views schematically showing manufacturing steps of a ferroelectric memory according to the first embodiment of the present invention.

DETAILED DESCRIPTION OF THE EMBODIMENT (1) A method of forming a ferroelectric film according to one embodiment of the present invention comprises applying pulsed laser light or pulsed lamp light to an amorphous oxide film formed over a substrate to form microcrystalline nuclei of oxide in the film, and applying pulsed laser light or pulsed lamp light to the film to crystallize the oxide, so that a ferroelectric film is formed.

In this method of forming a ferroelectric film, crystallization of the amorphous oxide in the film formed over the substrate is performed in a plurality of stages. First, by applying pulsed laser light or pulsed lamp light to the oxide film, impurities and the like are removed and microcrystalline nuclei of oxide are formed in the film by utilizing thermal energy of the laser light or the lamp light. And thereafter, by applying pulsed laser light or pulsed lamp light to the film including the microcrystalline nuclei, crystallization of the oxide is performed by utilizing thermal energy of the laser light or the lamp light, whereby a ferroelectric is formed.

According to this method of forming a ferroelectric film, the film can be heated in a short period of time by applying pulsed laser light or pulsed lamp light capable of instantaneously providing high energy. Therefore, according to this method of forming a ferroelectric film, thermal load applied to a portion other than the portion in which the oxide crystallizes can be reduced. Moreover, according to this method of forming a ferroelectric film, since impurities are removed by applying pulsed laser light or pulsed lamp light before the crystallization of the oxide, a high-quality ferroelectric film can be formed.

The term "formed over . . . " used herein is not limited to a case where a component is directly formed on another component, and includes a case where a component is formed over another component with a predetermined layer interposed in between. The term "pulsed" used herein refers to a state in which laser light or lamp light is applied a plurality of times at predetermined intervals. The intervals may be either constant or irregular.

(2) A method of forming a ferroelectric film according to another embodiment of the present invention comprises applying pulsed laser light only to a predetermined portion of an amorphous oxide film formed over a substrate to form microcrystalline nuclei of oxide in the film, and applying pulsed lamp light to the film to crystallize the oxide in the predetermined portion, so that a ferroelectric film is formed.

In this method of forming a ferroelectric film, crystallization of the amorphous oxide in the film formed over the substrate is performed in a plurality of stages, as in the method described in (1). However, this method of forming a ferroelectric film differs from the method described in (1) in that impurities and the like are removed and the microcrystalline nuclei of oxide are formed by applying pulsed laser light only to a predetermined portion of the film. This allows crystallization to occur only in the predetermined portion in which both of the laser light and the lamp light are applied by applying pulsed lamp light to the film when forming the ferroelectric film.

Therefore, effects the same as those of the method described in (1) can be obtained by this method of forming a ferroelectric film. Moreover, according to this method of forming a ferroelectric film, thermal load can be further reduced by applying laser light only to a predetermined portion. Furthermore, according to this method of forming a ferroelectric film, only a desired portion can be efficiently crystallized by applying laser light only to a predetermined portion.

(3) A method of forming a ferroelectric film according to further embodiment of the present invention comprises applying pulsed lamp light to an amorphous oxide film formed over a substrate to form microcrystalline nuclei of oxide in the film, and applying pulsed laser light only to a predetermined portion of the film to crystallize the oxide in the predetermined portion, so that a ferroelectric film is formed.

According to this method of forming a ferroelectric film, effects the same as those of the method described in (1) can also be obtained. Moreover, according to this method of forming a ferroelectric film, since only the portion in which both of the lamp light and the laser light are applied is crystallized by applying pulsed laser light only to a predetermined portion of the film, thermal load can be further reduced. Furthermore, according to this method of forming a ferroelectric film, only a desired portion can be efficiently crystallized.

(4) A method of forming a ferroelectric film according to still another embodiment of the present invention comprises applying pulsed laser light or pulsed lamp light to an amorphous oxide film formed over a substrate, and after applying the pulsed laser light or the pulsed lamp light to the amorphous oxide film, applying pulsed laser light or pulsed lamp light to the oxide film to crystallize oxide in the film, so that a ferroelectric film is formed.

According to this method of forming a ferroelectric film, thermal load applied to a portion other than the portion in which the oxide crystallizes can also be reduced. According to this method of forming a ferroelectric film, a high-quality ferroelectric film can also be formed.

The above method of forming a ferroelectric film may have the following features.

(A) The method may comprise forming a light blocking film over the oxide film in a portion other than the predetermined portion.

According to this feature, light is not applied to a portion other than the portion in which crystallization into the ferroelectric is performed by covering a portion other than the predetermined portion with the light blocking film. Therefore, thermal load applied to a portion other than the predetermined portion can be significantly reduced.

(B) The amorphous oxide film may be formed over the substrate with at least a light reflection film interposed in between.

According to this feature, light which is transmitted through the oxide film when applying the light can be reflected by the light reflection film and utilized for the heat treatment. Therefore, crystallization of a ferroelectric film can be efficiently performed in a shorter period of time.

(5) A method of manufacturing a ferroelectric memory according to still further embodiment of the present invention comprises forming a ferroelectric layer by using any one of the above methods of forming a ferroelectric film.

According to this method of manufacturing a ferroelectric memory, characteristics and yield of the resulting device can be improved by reducing thermal load applied when forming the ferroelectric layer, whereby productivity can be increased.

(6) A ferroelectric memory according to yet another embodiment of the present invention is manufactured by using any one of the above methods of manufacturing a ferroelectric memory.

(7) The above method of manufacturing a ferroelectric memory may be applied to a method of manufacturing a semiconductor device which includes a memory cell region having a ferroelectric layer and a circuit region. This method of manufacturing a semiconductor device comprises forming the memory cell region in a predetermined area over a substrate, and forming the circuit region over the substrate in an area other than the memory cell region, wherein a light blocking film is formed over the circuit region when forming the circuit region, and wherein the ferroelectric layer is formed by using the above method of manufacturing a ferroelectric memory after forming at least the light blocking film when forming the memory cell region.

According to this method of manufacturing a semiconductor device, since thermal load applied to the circuit region other than the memory cell region including the ferroelectric layer can be reduced by using the light blocking film, the degrees of freedom of the manufacturing process are increased. Moreover, according to this method of manufacturing a semiconductor device, thermal load applied to the circuit region other than the memory cell region is reduced. Therefore, according to this method of manufacturing a semiconductor device, metal interconnects and the like do not deteriorate during heating for crystallization, whereby characteristics and yield of the resulting device can be maintained favorably.

(8) A semiconductor device according to yet further embodiment of the present invention comprises a memory cell region including a ferroelectric layer and a circuit region which is formed over a substrate in an area other than the memory cell region, the semiconductor device being manufactured by using the above method of manufacturing a semiconductor device.

Preferred embodiments of the present invention are described below with reference to the drawings.

1. First Embodiment

FIGS. 1A to 1D are views schematically showing an example of manufacturing steps of a ferroelectric memory 1000 according to the first embodiment of the present invention.

As shown in FIG. 1A, a lower electrode 20 is formed over a base 10 in which a transistor 16 is formed over a substrate 11. The transistor 16 is a MOS transistor made up of a source/drain 12 and 15, a gate insulating film 13, and a gate 14. The transistor 16 may be formed by using a conventional method.

Figure 1B:
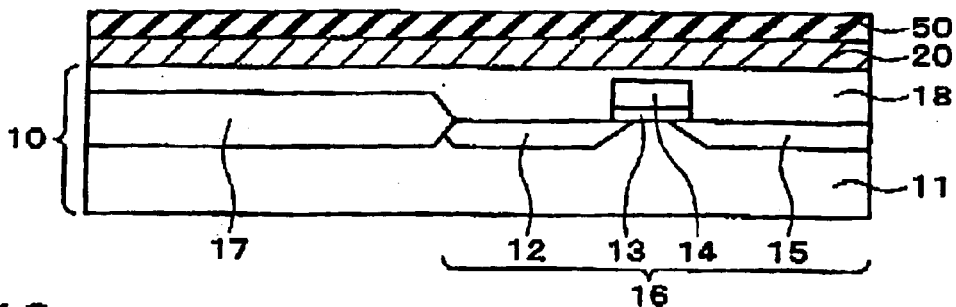
Figure 1C:
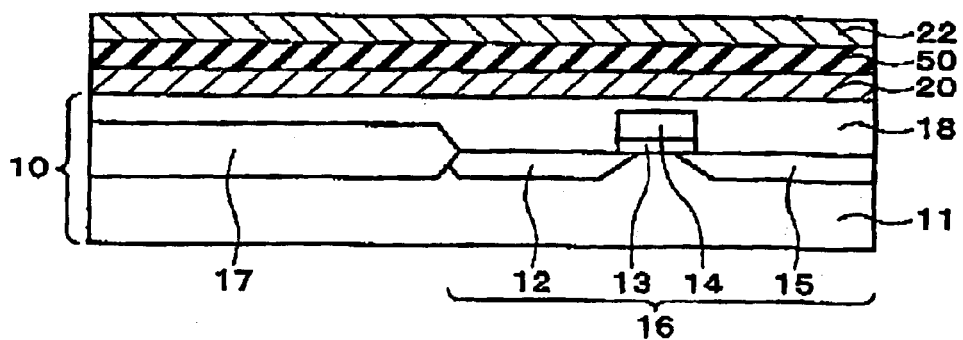
Figure 1D:
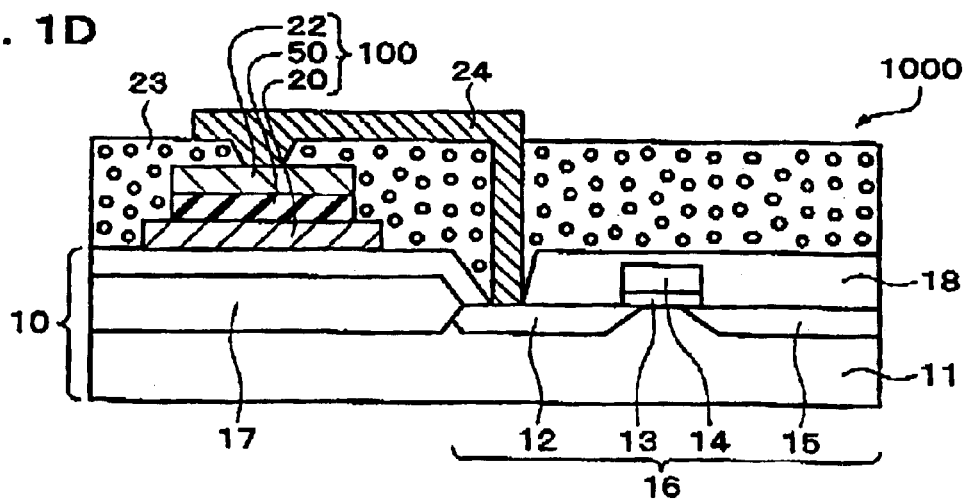

As shown in FIG. 1A, an oxide film 30 is formed over the lower electrode 20 by using a ferroelectric material. As shown in FIG. 1B, a ferroelectric film (ferroelectric layer) 50 is formed by crystallizing the oxide by applying pulsed laser light or pulsed lamp light to the oxide film 30 in a plurality of stages. As shown in FIG. 1C, an upper electrode 22 is formed over the ferroelectric film 50.

The steps shown in FIGS. 1A to 1C are hereinafter collectively called a film formation step. In the film formation step, an area in which the ferroelectric film 50 is formed by crystallizing the oxide may be either the entire oxide film 30 or only a desired portion of the oxide film 30 taking an etching step as described later into consideration.

The lower electrode 20, the ferroelectric film 50, and the upper electrode 22 are etched to form a ferroelectric capacitor 100. The etching step may be performed by using a conventional etching method.

After forming an insulating layer 23 over the ferroelectric capacitor 100, the transistor 16 is connected with the ferroelectric capacitor 100 through an interconnection layer 24 to obtain the ferroelectric memory 1000.

In the case of forming a plurality of ferroelectric memories 1000 over the substrate 11, each of the ferroelectric memories 1000 is isolated from the others by forming an element isolation region 17. The ferroelectric capacitor 100 is electrically insulated from the transistor 16 in an area other than the interconnection layer 24 by an interlayer dielectric 18 formed of a material such as silicon oxide in the base 10.

Specific examples of the film formation step of the method of manufacturing the ferroelectric memory 1000 according to the present embodiment are described below.

In the following examples, crystallization of the oxide is performed by using irradiation apparatuses illustrated in FIGS. 2A and 2B.

Figure 2A:
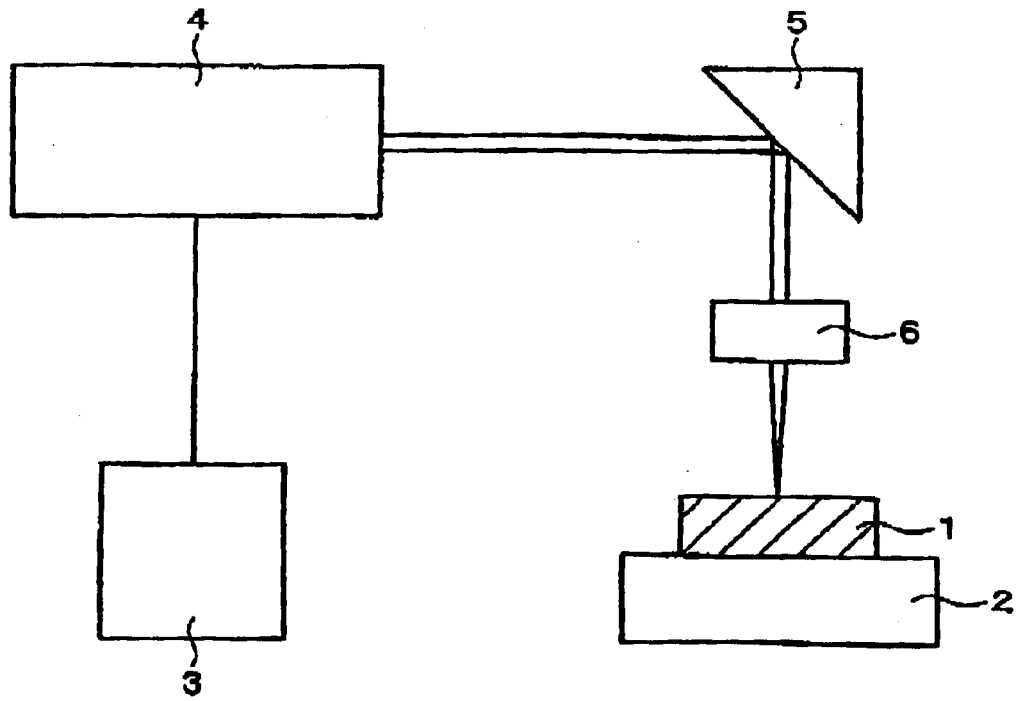
FIG. 2A is a view schematically showing a laser irradiation apparatus used in the first embodiment of the present invention.

FIG. 2A is a view schematically showing an example of a laser irradiation apparatus. In this laser irradiation apparatus, laser light emitted from a laser 4 which outputs light at a predetermined wavelength can be applied to a target 1 placed on a stage 2 through a mirror 5 and a lens 6. The stage 2 and the laser 4 are controlled by a control device 3 so that pulsed light can be applied to a desired portion of the target 1 by repeatedly outputting laser light at predetermined intervals.

Figure 2B:
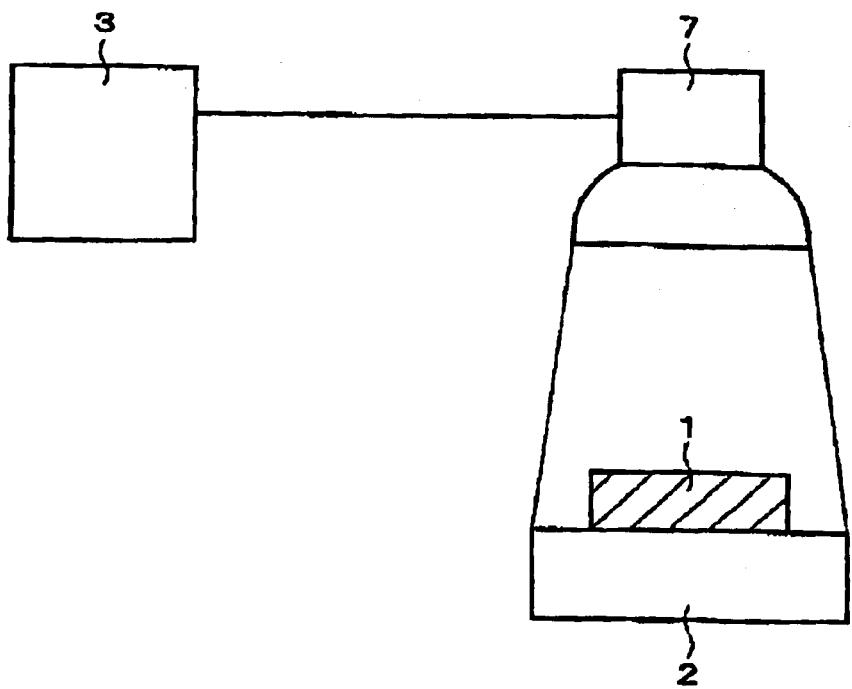
FIG. 2B is a view schematically showing a lamp irradiation apparatus used in the first embodiment of the present invention.

FIG. 2B is a view schematically showing an example of a lamp irradiation apparatus. In this lamp irradiation apparatus, lamp light output from a lamp 7 can be applied to the target 1 placed on the stage 2. The lamp 7 is controlled by the control device 3 so that pulsed light can be applied to the target 1 by repeatedly outputting lamp light at predetermined intervals.

1-1. EXAMPLE 1

Figure 3A:
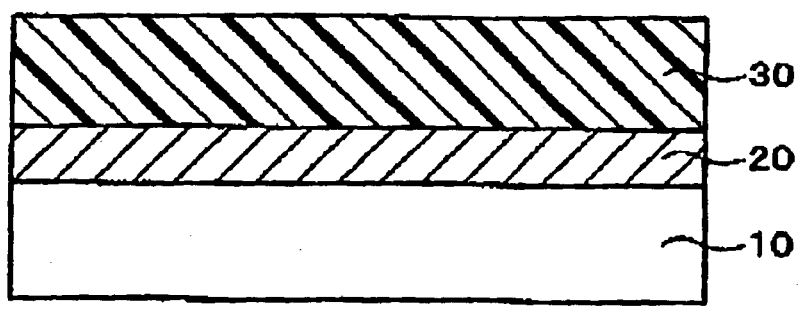
FIGS. 3A to 3C are views schematically showing formation steps of a ferroelectric film according to Examples 1 to 4 in the first embodiment of the present invention.
Figure 3B:
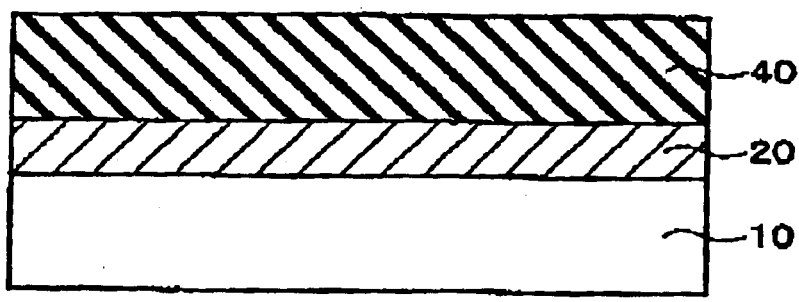
Figure 3C:
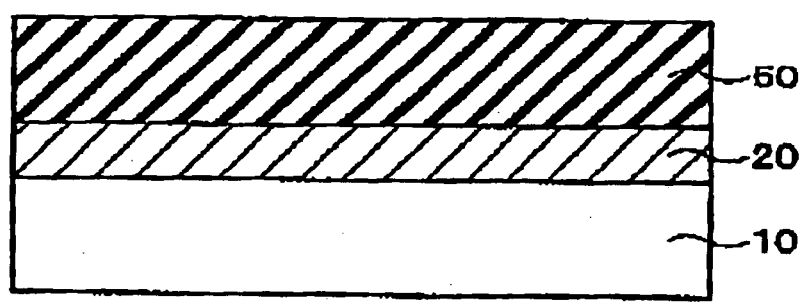

In Example 1, the film formation step is described with reference to FIGS. 3A to 3C.

A solution in which strontium 2-ethylhexanoate, bismuth 2-ethylhexanoate, and tantalum 2-ethylhexanoate as raw materials for the oxide film 30 which becomes ferroelectric were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, lamp light was applied to the oxide film 30 by causing a xenon lamp to emit light 10 times at a pulse width of 1 ms and an intensity of 10 $\mu$J/cm$^2$ to form microcrystalline nuclei 40 of oxide. As shown in FIG. 3C, the oxide was crystallized by applying lamp light to the oxide film by causing a xenon lamp to emit light 10 times at an intensity of 20 $\mu$J/cm$^2$ to form the SBT ferroelectric film 50 having a layered perovskite crystal structure.

1-2. EXAMPLE 2

In Example 2, the film formation step is described with reference to FIGS. 3A to 3C.

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, laser light was applied to the oxide film 30 by causing an excimer laser (wavelength: 248 nm) to scan 100 times at an intensity of 50 mJ/cm$^2$ to form the microcrystalline nuclei 40 of oxide. As shown in FIG. 3C, the oxide was crystallized by causing an excimer laser (wavelength: 248 nm) to scan 200 times at an intensity of 200 mJ/cm$^2$ to form the SBT ferroelectric film 50 having a layered perovskite crystal structure.

1-3. EXAMPLE 3

In Example 3, the film formation step is described with reference to FIGS. 3A to 3C.

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, laser light was applied to the oxide film 30 by causing an excimer laser (wavelength: 248 nm) to scan 100 times at an intensity of 50 mJ/cm$^2$ to form the microcrystalline nuclei 40 of oxide. As shown in FIG. 3C, the oxide was crystallized by applying lamp light to the oxide film by causing a xenon lamp to emit light 10 times at a pulse width of 1 ms and an intensity of 20 $\mu$J/cm$^2$ to form the SBT ferroelectric film 50 having a layered perovskite crystal structure.

1-4. EXAMPLE 4

In Example 4, the film formation step is described with reference to FIGS. 3A to 3C.

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, laser light was applied to the oxide film 30 by causing an excimer laser (wavelength: 248 nm) to scan 100 times at an intensity of 50 mJ/cm$^2$ to form the microcrystalline nuclei 40 of oxide. As shown in FIG. 3C, the oxide was crystallized by applying lamp light to the oxide film by causing a xenon lamp to emit light 10 times at a pulse width of 1 ms and an intensity of 20 µJ/cm$^2$ to form the SBT ferroelectric film 50 having a layered perovskite crystal structure.

1-5. EFFECT OF EXAMPLES 1 TO 4

According to the film formation step in Examples 1 to 4, since the oxide can be heated in a short period of time by applying pulsed laser light or pulsed lamp light capable of instantaneously providing high energy, thermal load applied to a portion other than the portion in which the oxide crystallizes, such as the lower electrode 20, can be reduced. Moreover, since impurities are removed by applying pulsed laser light or pulsed lamp light before the crystallization of the oxide, a high-quality ferroelectric film can be formed.

1-6. EXAMPLE 5

Figure 4A:
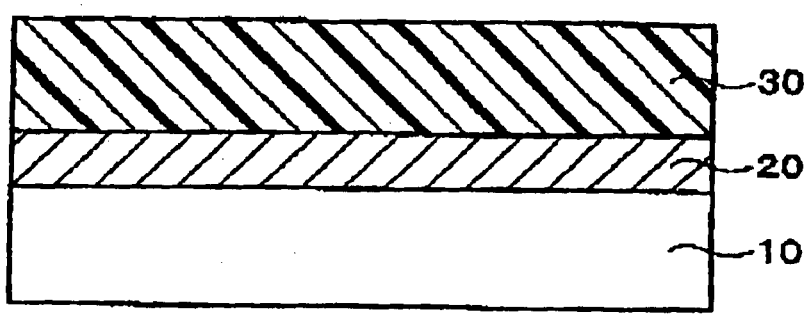
FIGS. 4A to 4C are views schematically showing formation steps of a ferroelectric film according to Example 5 in the first embodiment of the present invention.
Figure 4B:
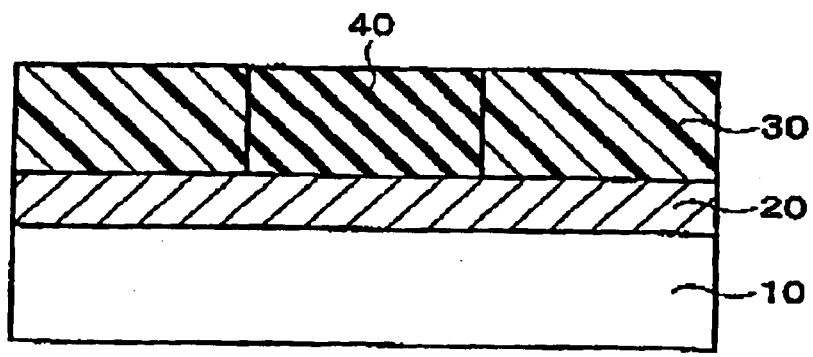
Figure 4C:
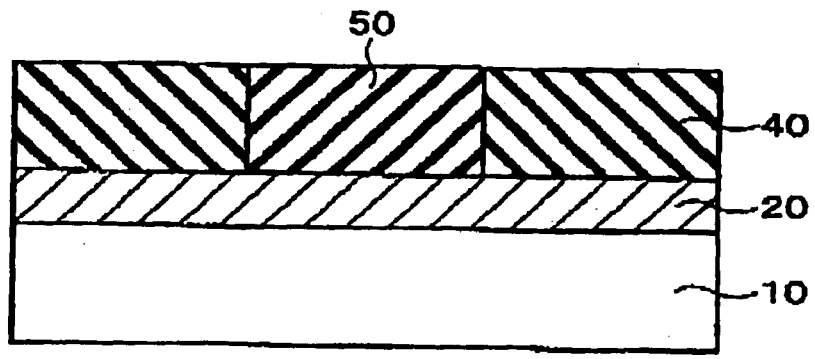

In Example 5, the film formation step is described with reference to FIGS. 4A to 4C.

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 4A, the solution was applied by using a spin coating method or the like and dried at 160° C. for 90 seconds and at 400° C. for 60 seconds to form the amorphous oxide film 30. As shown in FIG. 4B, laser light was applied to the oxide film 30 only in an area in which the ferroelectric capacitor 100 is formed by causing an excimer laser (wavelength: 248 nm) to scan 50 times at an intensity of 50 mJ/cm$^2$ to form the microcrystalline nuclei 40 of oxide. As shown in FIG. 4C, lamp light was applied to the entire surface of the film by causing a xenon lamp to emit light 10 times at a pulse width of 1 ms and an intensity of 15 µJ/cm$^2$. As a result, only the area in which laser light and lamp light were applied was crystallized to obtain the PZT ferroelectric film 50 having a perovskite crystal structure.

1-7. EXAMPLE 6

Figure 5A:
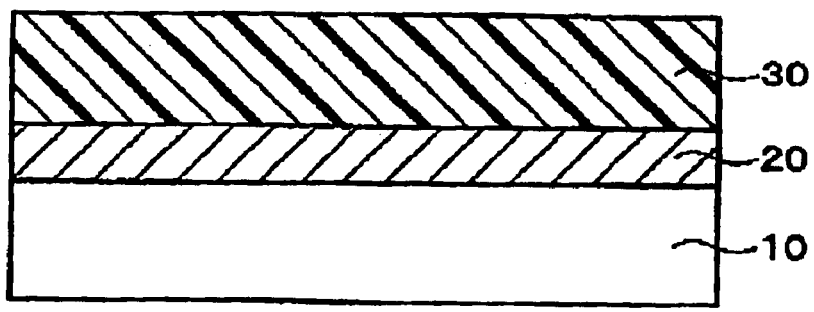
FIGS. 5A to 5C are views schematically showing formation steps of a ferroelectric film according to Example 6 in the first embodiment of the present invention.
Figure 5B:
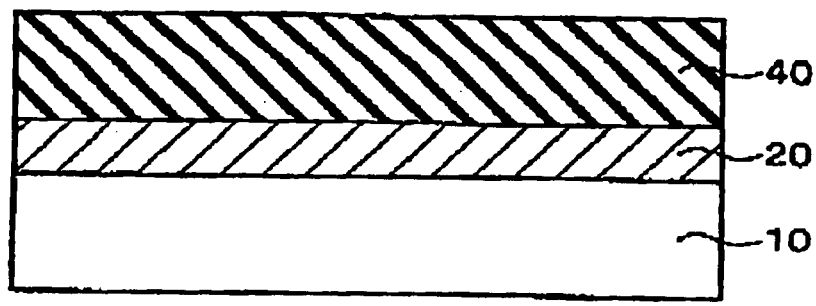
Figure 5C:
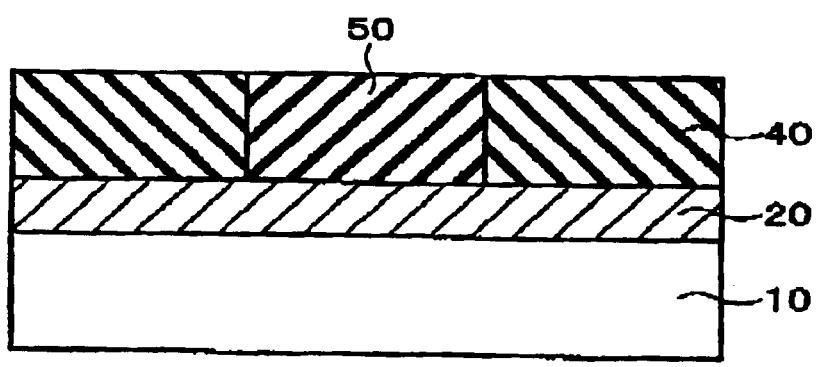

In Example 6, the film formation step is described with reference to FIGS. 5A to 5C.

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 5A, the solution was applied by using a spin coating method or the like and dried at 160° C. for 90 seconds and at 400° C. for 60 seconds to form the amorphous oxide film 30. As shown in FIG. 5B, lamp light was applied to the entire surface of the oxide film 30 by causing a xenon lamp to emit light 10 times at a pulse width of 1 ms and an intensity of 10 µJ/cm$^2$ to form the microcrystalline nuclei 40 of oxide. As shown in FIG. 5C, laser light was applied only to an area in which the ferroelectric capacitor 100 is formed by causing an excimer laser (wavelength: 248 nm) to scan 200 times at an intensity of 150 mJ/cm$^2$. As a result, only the area in which laser light and lamp light were applied was crystallized to obtain the PZT ferroelectric film 50 having a perovskite crystal structure.

1-8. EFFECT OF EXAMPLES 5 AND 6

According to the film formation step in Examples 5 and 6, since only the area in which lamp light and laser light are applied is crystallized by applying pulsed laser light only to a predetermined portion, effects the same as those in Examples 1 to 4 can be obtained. Moreover, this film formation step enables thermal load applied to an area other than the predetermined portion such as the lower electrode 20 to be further reduced, and only a desired portion to be efficiently crystallized.

In Examples 5 and 6, the oxide film including the microcrystalline nuclei 40 in an area other than the predetermined portion in which the oxide crystallizes may be used as a part of the insulating layer 23 of the ferroelectric memory 1000. According to this feature, damage to the ferroelectric film 50 during the etching step for forming the ferroelectric capacitor 100 can be reduced. Moreover, the formation step of the insulating layer 23 can be simplified.

1-9. EXAMPLE 7

Figure 6A:
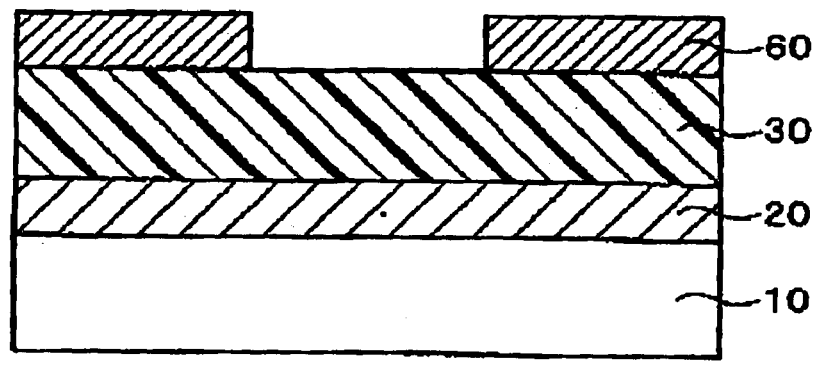
FIGS. 6A to 6C are views schematically showing formation steps of a ferroelectric film according to Examples 7 and 8 in the first embodiment of the present invention.
Figure 6B:
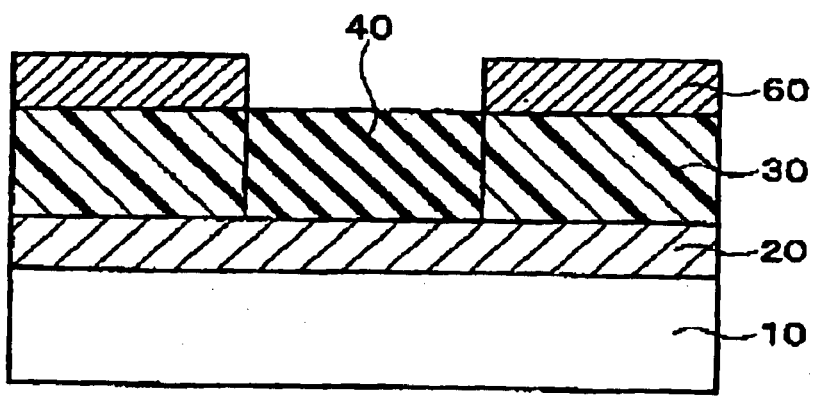
Figure 6C:
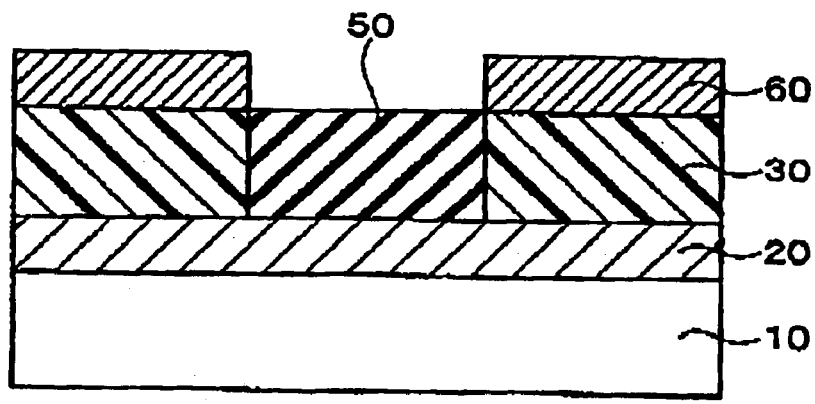

In Example 7, the film formation step is described with reference to FIGS. 6A to 6C.

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 6A, the solution was applied by using a spin coating method or the like and dried at 160° C. for 90 seconds and at 400° C. for 60 seconds to form the amorphous oxide film 30. Then, a light blocking film 60 consisting of a metal such as Al, Au, Ag, Cu, Pt, or Ir was formed over the oxide film 30. As shown in FIG. 6B, lamp light was applied to the entire surface of the oxide film 30 by causing a xenon lamp to emit light 10 times at a pulse width of 1 ms and an intensity of 10 µJ/cm$^2$ to form the microcrystalline nuclei 40 of oxide. The oxide film 30 under the light blocking film 60 remained amorphous since light was not applied. As shown in FIG. 6C, laser light was applied only to an area in which the ferroelectric capacitor 100 is formed by causing an excimer laser (wavelength: 248 nm) to scan 200 times at an intensity of 150 mJ/cm$^2$. As a result, only the area in which laser light and lamp light were applied was crystallized to obtain the PZT ferroelectric film 50 having a perovskite crystal structure. In this example, the light blocking film 60 may be removed by etching or the like before the step of applying laser light shown in FIG. 6C.

1-10. EXAMPLE 8

In Example 8, the film formation step is described with reference to FIGS. 6A to 6C.

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 6A, the solution was applied by using a spin coating method or the like and dried at 160° C. for 90 seconds and at 400° C. for 60 seconds to form the amorphous oxide film 30. Then, a light blocking film 60 consisting of a metal such as Al, Au, Ag, Cu, Pt, or Ir was formed over the oxide film 30. It suffices that the light blocking film 60 be formed before a step of applying lamp light shown in FIG. 6C as described later. As shown in FIG. 6B, laser light was applied to the oxide film 30 only in an area in which the ferroelectric capacitor 100 is formed by causing an excimer laser (wavelength: 248 nm) to scan 50 times at an intensity of 50 mJ/cm$^2$ to form the microcrystalline nuclei 40 of oxide. The oxide film 30 under the light blocking film 60 remained amorphous since light was not applied. As shown in FIG. 6C, lamp light was applied to the entire surface of the film by causing a xenon lamp to emit light 10 times at a pulse width of 1 ms and an intensity of 15 µJ/cm$^2$. As a result, only the area in which laser light and lamp light were applied was crystallized to obtain the PZT ferroelectric film 50 having a perovskite crystal structure.

1-11. EFFECT OF EXAMPLES 7 AND 8

According to the film formation step in Examples 7 and 8, since light is kept from being applied to a portion other than the portion in which the ferroelectric is crystallized by covering the area other than the predetermined portion with the light blocking film 60, thermal load applied to an area other than the predetermined portion such as the lower electrode 20 can be significantly reduced.

In Examples 7 and 8, the oxide film 30 in the area other than the predetermined portion in which the oxide crystallizes may be used as a part of the insulating layer 23 of the ferroelectric memory 1000 in the same manner as in Examples 5 and 6. According to this feature, damage to the ferroelectric film 50 can be reduced during the etching step for forming the ferroelectric capacitor 100. Moreover, the formation step of the insulating layer 23 can be simplified.

1-12. ANOTHER EXAMPLE

The film formation step in the present embodiment may be carried out according to a feature other than those illustrated in Examples 1 to 8.

In Examples 1 to 8, if the lower electrode 20 formed over the substrate 10 is formed by using a material which reflects laser light or lamp light (metal such as Ir or Pt), light which is transmitted through the oxide film 30 (oxide film including the microcrystalline nuclei 40) during irradiation can be reflected by a light reflection film and utilized for the heat treatment. According to this feature, a ferroelectric can be efficiently crystallized in a shorter period of time. In the case where the lower electrode 20 is not used as a light reflection film, a light reflection film may be separately formed under the oxide film 30.

The intensity of light applied to the amorphous oxide film 30 may be set to be equal to or lower than the intensity of light applied for crystallizing the oxide, for example. Therefore, the intensity of light applied in a plurality of stages is not limited to that illustrated in Examples 1 to 8, and may be appropriately set depending on the crystallizing temperature of the ferroelectric material.

The number of pulses (number of irradiations) of light applied to the amorphous oxide film 30 may be set to be equal to or smaller than the number of pulses (number of irradiations) of light applied for crystallizing the oxide, for example. Therefore, the number of pulses of light applied in a plurality of stages is not limited to that illustrated in Examples 1 to 8, and may be appropriately set depending on the crystallization state of the ferroelectric material.

Examples 1 to 4 illustrate the case of forming the SBT ferroelectric film and Examples 5 to 8 illustrate the case of forming the PZT ferroelectric film. However, an arbitrary ferroelectric film may be formed by using a conventional ferroelectric material in the film formation step by using the method illustrated in each example. As examples of ferroelectric materials other than those illustrated above, a material in which a metal such as niobium, nickel, or magnesium is added to PZT or SBT can be given. As specific examples of other ferroelectric materials, lead titanate (PbTiO$_3$), lead zirconate (PbZrO$_3$), lead lanthanum titanate ((Pb,La)TiO$_3$), lead lanthanum zirconate titanate ((Pb,La)(Zr,Ti)O$_3$), lead magnesium niobate zirconium titanate (Pb(Zr,Ti)(Mg,Nb)O$_3$), and the like may be used.

As the method of forming the oxide film 30 in the above examples, a conventional deposition method such as a spin coating method or a dipping method using a sol-gel material or an MOD material, a sputtering method, an MOCVD method, or a laser ablation method may be used.

In the above examples, there are no predetermined limitations to the material and the deposition method for the lower electrode 20. Any conventional material and deposition method may be used. As examples of the electrode material, Ir, IrO$_x$, Pt, Ru, RuO$_x$, SrRuO$_x$, LaSrCoO$_x$, and the like can be given. As examples of the method of depositing the electrode film, a vapor-phase method, liquid-phase method, and the like can be given. This also applies to the upper electrode 22.

According to the method of manufacturing the ferroelectric memory 1000 in the present embodiment, characteristics and yield of the ferroelectric memory 1000 can be increased by reducing thermal load applied to the transistor 16 and the like in the step of forming the ferroelectric film 50, whereby productivity can be increased.

2. Second Embodiment

FIGS. 7A to 7D are views schematically showing an example of manufacturing steps of a ferroelectric memory 1100 according to the second embodiment of the present invention. Sections having substantially the same functions as the sections shown in FIGS. 1A to 1D are indicated by the same symbols. Detailed description of these sections is omitted.

Figure 7A:
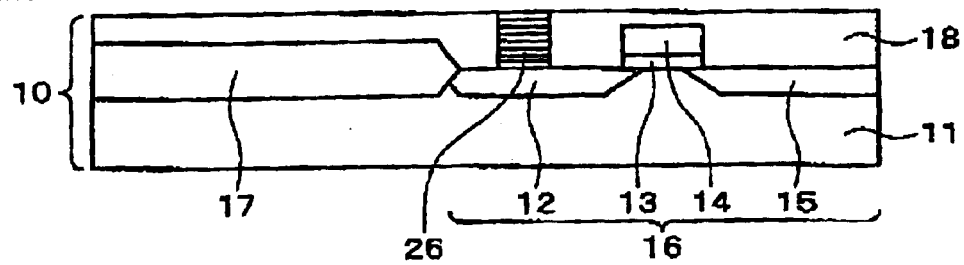
FIGS. 7A to 7D are views schematically showing manufacturing steps of a ferroelectric memory according to the second embodiment of the present invention.
Figure 7B:
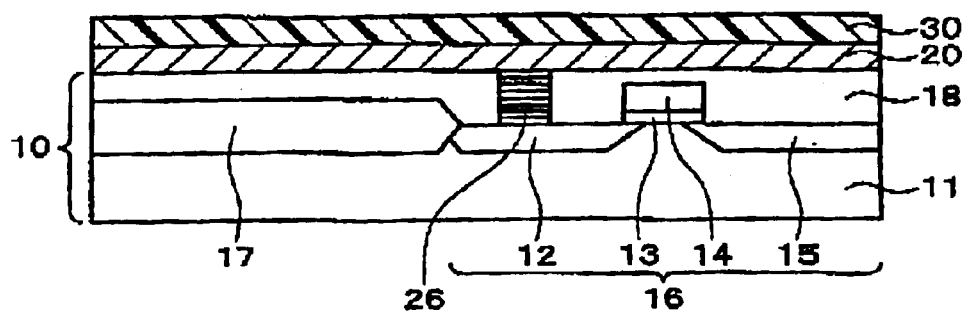
Figure 7C:
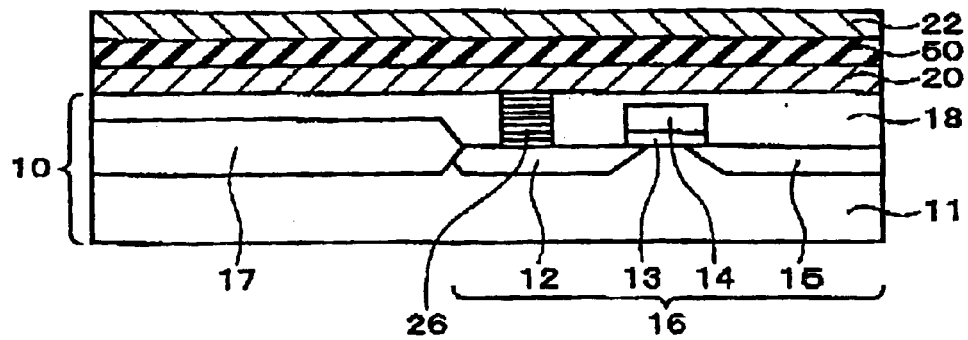

The lower electrode 20 is formed over the base 10 in which the transistor 16 and a plug electrode 26 are formed over the substrate 11 as shown in FIG. 7A. As shown in FIG. 7B, the oxide film 30 is formed over the lower electrode 20 by using a ferroelectric material. As shown in FIG. 7C, the ferroelectric film (ferroelectric layer) 50 is formed by crystallizing the oxide by applying pulsed laser light or pulsed lamp light to the oxide film 30 separately in a plurality of stages. The upper electrode 22 is then formed over the ferroelectric film 50. In the film formation step shown in FIGS. 7A to 7C, an area in which the ferroelectric film 50 is formed by crystallizing the oxide may be either the entire oxide film 30 or only a desired portion of the oxide film 30 taking an etching step as described later into consideration. In the film formation step, the ferroelectric film 50 may be formed by applying the example described in the first embodiment.

Figure 7D:
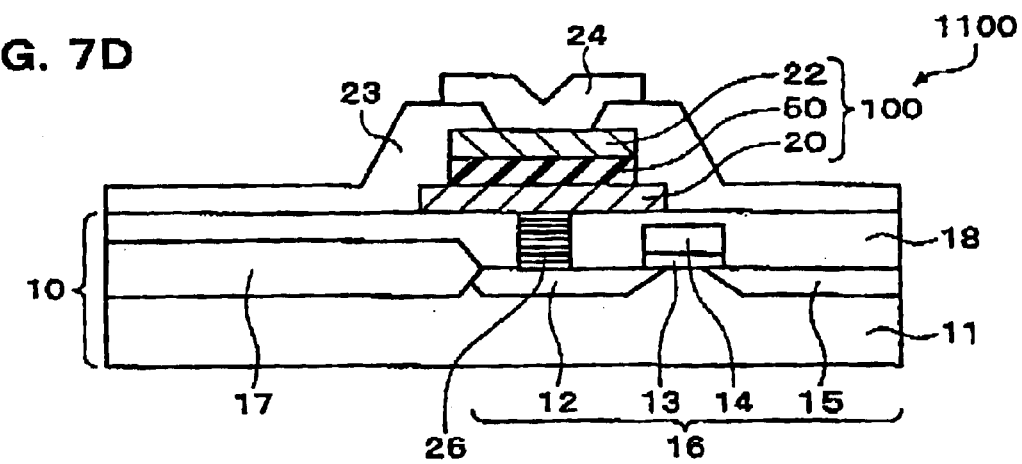

As shown in FIG. 7D, the lower electrode 20, the ferroelectric film 50, and the upper electrode 22 are etched to form the ferroelectric capacitor 100. The ferroelectric capacitor 100 is connected with the transistor 16 through the plug electrode 26. After forming the insulating layer 23 over the ferroelectric capacitor 100, the interconnection layer 24 for connecting with the outside is formed to obtain the ferroelectric memory 1100.

Therefore, according to the method of manufacturing the ferroelectric memory 1100 in the present embodiment, characteristics and yield of the ferroelectric memory 1100 can be increased by reducing thermal load applied to the transistor 16 and the like in the step of forming the ferroelectric film 50, whereby productivity can be increased.

3. Third Embodiment

Figure 8A:
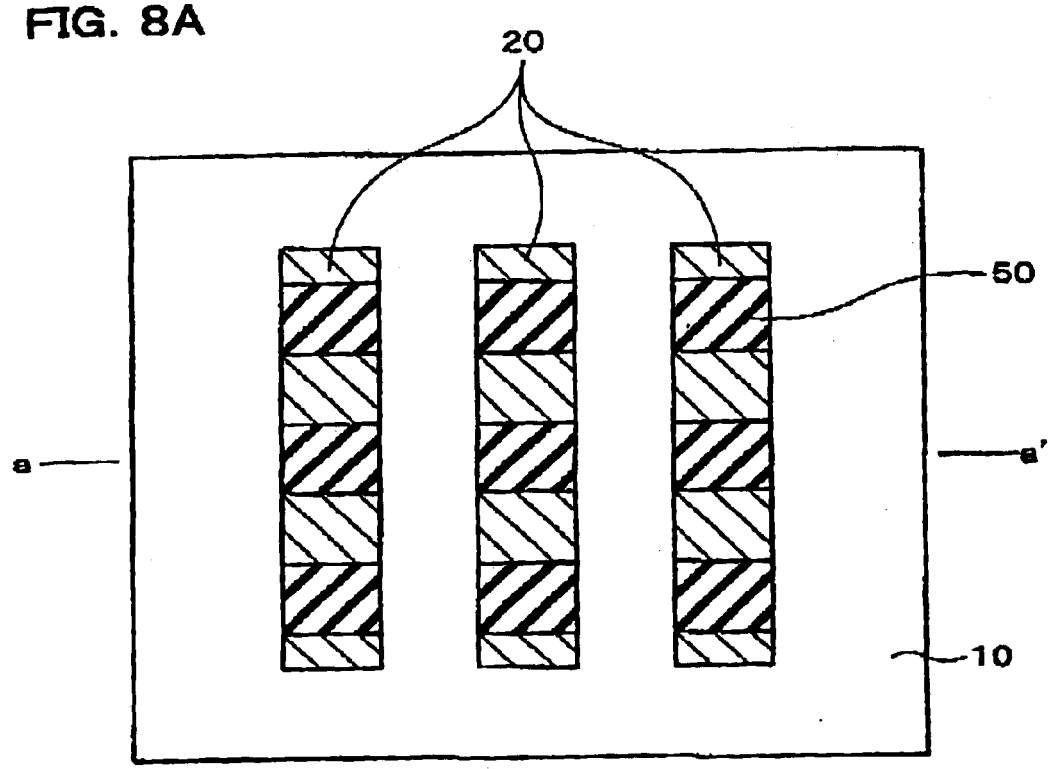
FIG. 8A is a view schematically showing a manufacturing step of a ferroelectric memory cell according to a third embodiment of the present invention.
Figure 8B:
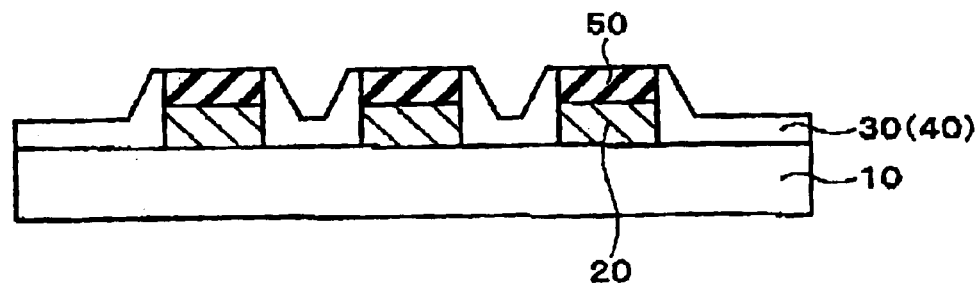
FIG. 8B is a cross-sectional view along the line a–a' shown in FIG. 8A.
Figure 9A:
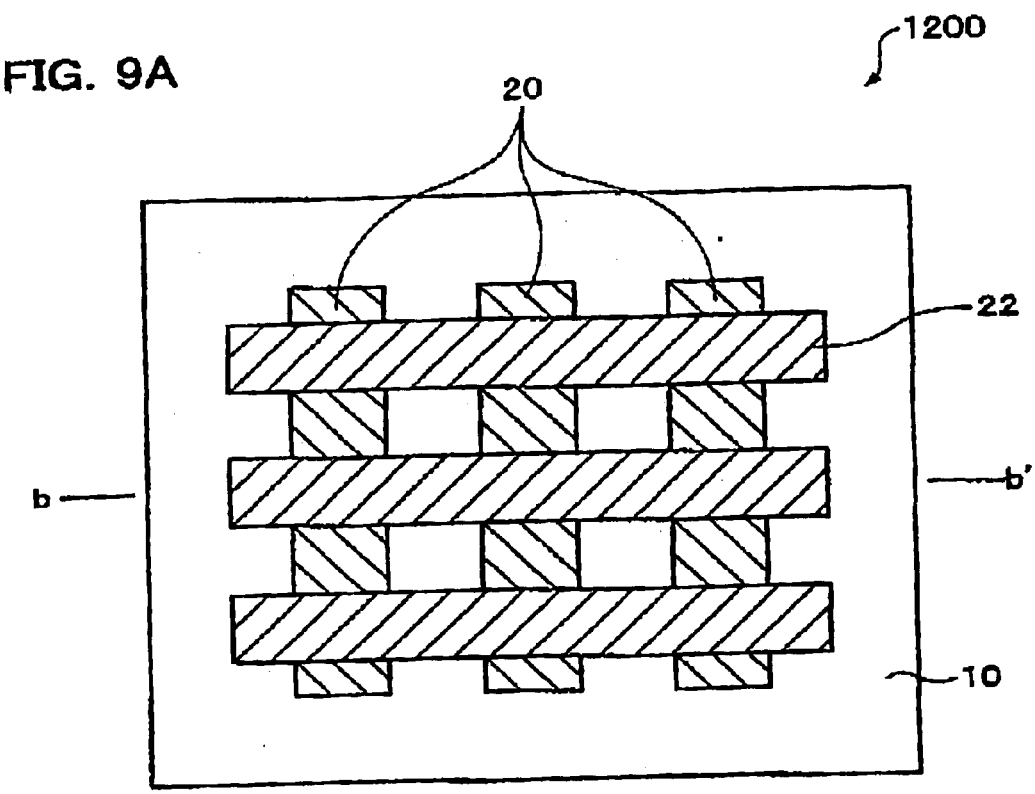
FIG. 9A is a view schematically showing a manufacturing step of a ferroelectric memory cell according to the third embodiment of the present invention.

FIGS. 8A, 8B, 9A, and 9B are views schematically showing an example of manufacturing steps of a ferroelectric memory cell 1200 according to the third embodiment of the present invention. Sections having substantially the same functions as the sections shown in FIGS. 1A to 1D are indicated by the same symbols. Detailed description of these sections is omitted. In FIGS. 8A and 9A, illustration of the uncrystallized oxide film 30 (or oxide film including the microcrystalline nuclei 40) is omitted for convenience of description.

In the method of manufacturing the ferroelectric memory cell 1200 according to the present embodiment, a plurality of stripe-shaped lower electrodes 20 are formed over the substrate 10, as shown in FIGS. 8A and 8B. As shown in FIGS. 8A and 8B, after forming the oxide film 30 over the lower electrodes 20 by using the film formation step according to the example described in the first embodiment, only a predetermined portion of the oxide film 30 is crystallized to form the ferroelectric film (ferroelectric layer) 50. The amorphous oxide film 30 (or oxide film including the microcrystalline nuclei 40) which is not crystallized in the film formation step may be used as an insulating film for insulating the electrodes from one another. This configuration enables the etching step of the ferroelectric film 50 and the formation step of the insulating film to be omitted, whereby the manufacturing process can be simplified. The insulating film may be formed separately.

Figure 9B:
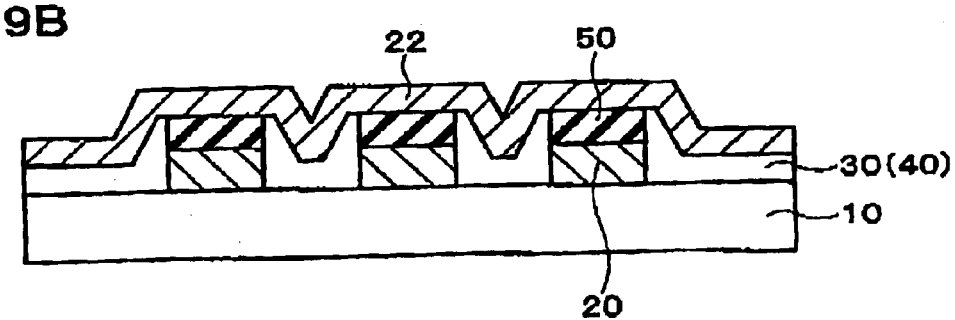
FIG. 9B is a cross-sectional view along the line b–b' shown in FIG. 9A.

As shown in FIGS. 9A and 9B, a plurality of stripe-shaped upper electrodes 22 are formed to intersect the lower electrodes 20 at right angles in the area in which the ferroelectric film 50 is formed. The ferroelectric memory cell 1200 in which the ferroelectric film 50 is interposed between the lower electrodes 20 and the upper electrodes 22 can be formed by these steps.

Therefore, according to the method of manufacturing the ferroelectric memory cell 1200 in the present embodiment, characteristics and yield of the ferroelectric memory cell 1200 can be increased by reducing thermal load applied to the lower electrodes 20 and the like in the step of forming the ferroelectric film 50, whereby productivity can be increased.

4. Fourth Embodiment

Figure 10A:
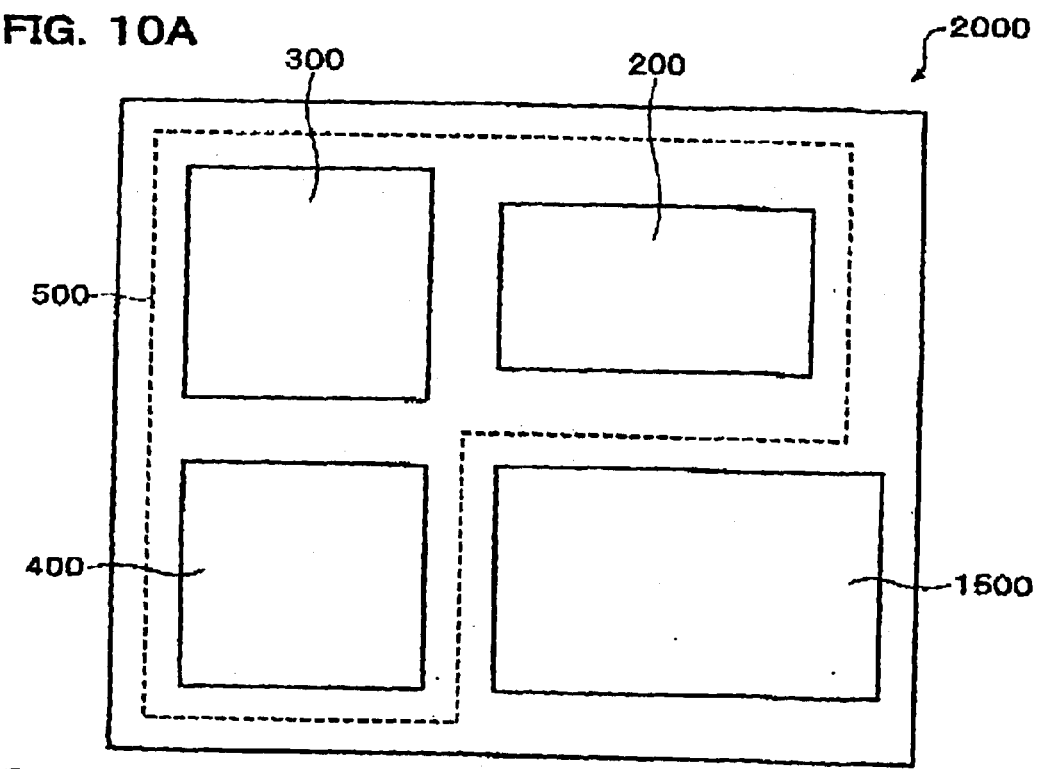
FIG. 10A is a view schematically showing a semiconductor device according to the fourth embodiment of the present invention.

FIG. 10A is a view schematically showing a semiconductor device 2000 according to the fourth embodiment of the present invention. In this semiconductor device, a memory cell region 1500 including ferroelectric capacitors and a circuit region 500 consisting of semiconductor circuits 200, 300, and 400 are formed over a single substrate. The memory cell region 1500 is made up of a plurality of ferroelectric memories 1000 and 1100 described in the first and second embodiments and the ferroelectric memory cell 1200 described in the third embodiment, for example. As examples of the semiconductor circuits 200, 300, and 400, a driver circuit and a calculation circuit for the memory cell region 1500, other memory devices, and the like can be given.

In the semiconductor device 2000 having such a structure, since a heat treatment is performed at a high temperature when forming the ferroelectric capacitors, if the circuit region 500 is formed over the substrate before the memory cell region 1500, a problem relating to deterioration of characteristics of each of the semiconductor circuits 200, 300, and 400 included in the circuit region 500 occurs.

Figure 10B:
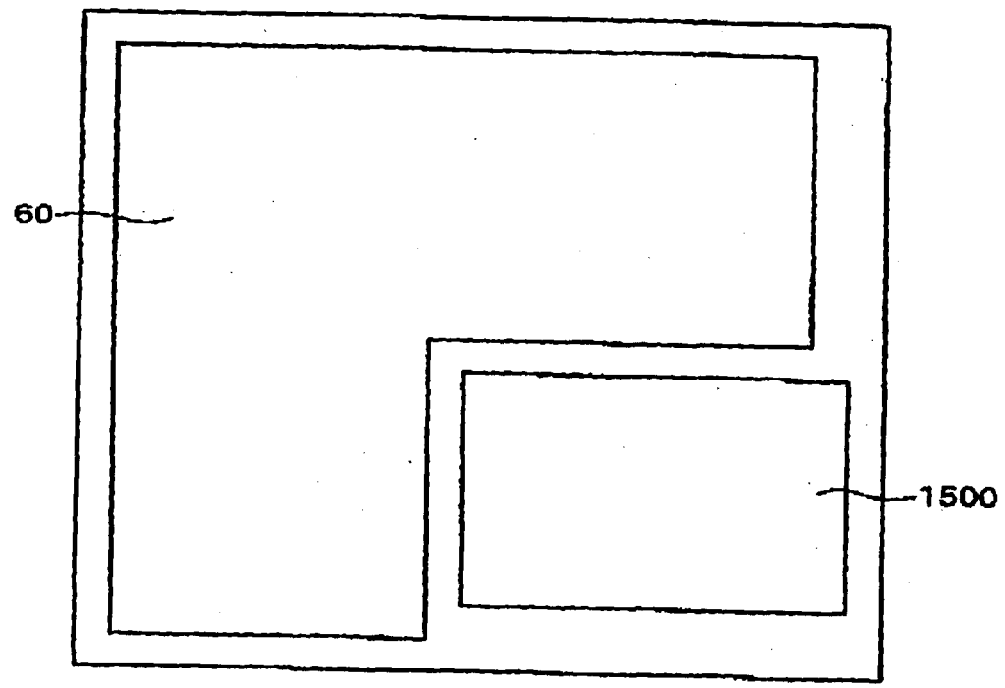
FIG. 10B is a view schematically showing a manufacturing step of the semiconductor device according to the fourth embodiment of the present invention.

Therefore, in the semiconductor device 2000 according to the present embodiment, the memory cell region 1500 is formed over the substrate after forming the circuit region 500 over the substrate and forming the light blocking film 60 consisting of a metal or the like over the circuit region 500, as shown in FIG. 10B. The ferroelectric capacitor included in the forming a ferroelectric film described in the example according to the first embodiment.

In other words, laser light or lamp light applied for crystallizing the oxide does not affect the circuit region 500 under the light blocking film 60 due to the presence of the light blocking film 60. Therefore, according to the method of manufacturing the semiconductor device 2000 in the present embodiment, since thermal load applied to the circuit region 500 other than the memory cell region 1500 including the ferroelectric layer can be reduced by forming the light blocking film 60, the degrees of freedom of the manufacturing process are increased. Moreover, according to this manufacturing method, since thermal load applied to the circuit region 500 is reduced, metal interconnects and the like in the circuit do not deteriorate during heating, whereby characteristics of the semiconductor circuits 200, 300, and 400 can be secured and the yield of the semiconductor device 2000 can be improved.

The preferred embodiments of the present invention are described above. However, the present invention is not limited to these embodiments. Various modifications and variations are possible within the scope of the present invention.

What is claimed is:

1. A method of forming a ferroelectric film comprising:
applying pulsed laser light or pulsed lamp light to an amorphous oxide film formed over a substrate to form microcrystalline nuclei of oxide in the film, and
applying pulsed laser light or pulsed lamp light to the film to crystallize the oxide, so that a ferroelectric film is formed.

2. A method of forming a ferroelectric film comprising:
applying pulsed laser light only to a predetermined portion of an amorphous oxide film formed over a substrate to form microcrystalline nuclei of oxide in the film, and
applying pulsed lamp light to the film to crystallize the oxide in the predetermined portion, so that a ferroelectric film is formed.

3. A method of forming a ferroelectric film comprising:
applying pulsed lamp light to an amorphous oxide film formed over a substrate to form microcrystalline nuclei of oxide in the film, and
applying pulsed laser light only to a predetermined portion of the film to crystallize the oxide in the predetermined portion, so that a ferroelectric film is formed.

4. A method of forming a ferroelectric film comprising:
applying pulsed laser light or pulsed lamp light to an amorphous oxide film formed over a substrate, and
after applying the pulsed laser light or the pulsed lamp light to the amorphous oxide film, applying pulsed laser light or pulsed lamp light to the oxide film to crystallize oxide in the film, so that a ferroelectric film is formed.

5. The method of forming a ferroelectric film as defined in claim 2, comprising forming a light blocking film over the oxide film in a portion other than the predetermined portion.

6. The method of forming a ferroelectric film as defined in claim 1,
wherein the amorphous oxide film is formed over the substrate with at least a light reflection film interposed in between.

7. The method of forming a ferroelectric film as defined in claim 1,
wherein intensity of the light applied to the amorphous oxide film differs from intensity of the light applied for crystallizing the oxide.

8. The method of forming a ferroelectric film as defined in claim 1,
wherein a number of pulses of the light applied to the amorphous oxide film differs from a number of pulses of the light applied for crystallizing the oxide.

9. The method of forming a ferroelectric film as defined in claim 1,
wherein the ferroelectric film has a perovskite crystal structure.

10. The method of forming a ferroelectric film as defined in claim 1,
wherein the ferroelectric film has a layered perovskite crystal structure.

11. A method of manufacturing a ferroelectric memory comprising forming a ferroelectric layer by using the method of forming a ferroelectric film as defined in claim 1.

12. A ferroelectric memory manufactured by using the method of manufacturing a ferroelectric memory as defined in claim 11.

13. The ferroelectric memory as defined in claim 12,
wherein an insulating layer disposed around the ferroelectric layer includes the microcrystalline nuclei of oxide.

14. The ferroelectric memory as defined in claim 12,
wherein an electrode layer disposed under the ferroelectric layer has a light reflecting function.

15. A method of manufacturing a semiconductor device, the semiconductor device including a memory cell region having a ferroelectric layer and a circuit region, the method comprising:
forming the memory cell region in a predetermined area over a substrate, and
forming the circuit region over the substrate in an area other than the memory cell region,
wherein a light blocking film is formed over the circuit region when forming the circuit region, and
wherein the ferroelectric layer is formed by using the method of manufacturing a ferroelectric memory as defined in claim 11 after forming at least the light blocking film when forming the memory cell region.

16. A semiconductor device comprising a memory cell region including a ferroelectric layer and a circuit region which is formed over a substrate in an area other than the memory cell region,
the semiconductor device being manufactured by using the method of manufacturing a semiconductor device as defined in claim 15.

* * * * *